(12) United States Patent
Lampin et al.

(10) Patent No.: US 10,333,267 B2
(45) Date of Patent: Jun. 25, 2019

(54) TERAHERTZ LASER, TERAHERTZ SOURCE AND USE OF SUCH A TERAHERTZ LASER

(71) Applicants: CENTRE NATIONAL DE LA RECHERCHE SCIENTIFIQUE, Paris (FR); Universite de Lille, Lille (FR)

(72) Inventors: Jean-François Lampin, Templeuve (FR); Antoine Pagies, Lille (FR)

(73) Assignees: CENTRE NATIONAL DE LA RECHERCHE SCIENTIFIQUE, Paris (FR); UNIVERSITE DE LILLE, Lille (FR)

( * ) Notice: Subject to any disclaimer, the term of this patent is extended or adjusted under 35 U.S.C. 154(b) by 0 days.

(21) Appl. No.: 15/752,976

(22) PCT Filed: Aug. 18, 2016

(86) PCT No.: PCT/EP2016/069622
§ 371 (c)(1),
(2) Date: Feb. 15, 2018

(87) PCT Pub. No.: WO2017/029363
PCT Pub. Date: Feb. 23, 2017

(65) Prior Publication Data
US 2018/0254596 A1   Sep. 6, 2018

(30) Foreign Application Priority Data

Aug. 20, 2015   (FR) ...................... 15 57827

(51) Int. Cl.
*H01S 1/06* (2006.01)
*H01S 3/22* (2006.01)
(Continued)

(52) U.S. Cl.
CPC .......... *H01S 3/0943* (2013.01); *G02B 6/0006* (2013.01); *G02B 6/0008* (2013.01);
(Continued)

(58) Field of Classification Search
CPC .......... H01S 1/06; H01S 2302/02; H01S 5/34; H01S 3/0943
(Continued)

(56) References Cited

U.S. PATENT DOCUMENTS 5,997,590 A * 12/1999 Johnson ................. C10L 1/328
44/301
6,331,993 B1 * 12/2001 Brown ................ H01S 3/09415
372/55

OTHER PUBLICATIONS

French Search Report for French Application FR 1557827 dated Apr. 18, 2016.
(Continued)

*Primary Examiner* — Tuan N Nguyen
(74) *Attorney, Agent, or Firm* — Pearne & Gordon LLP

(57) ABSTRACT

A terahertz laser suitable for emitting at least one first electromagnetic radiation, a first emission frequency of which is between 700 and 1200 GHz. The laser comprises an infrared laser source and a resonant cavity arranged to be optically pumped by the infrared laser source, the resonant cavity containing ammonia gas as an amplifier medium and having at least one configuration in which the resonant cavity is a resonant cavity at the first emission frequency. The infrared laser source is a continuous semiconductor laser source capable of exciting molecules of the amplifier medium from an initial energy level to at least one first excited energy level, the molecules of the amplifier medium placed in the first energy level being able to relax through a pure inversion transition for which the relaxation energy corresponds to the first emission frequency.

14 Claims, 5 Drawing Sheets

(51) Int. Cl.
*H01S 5/00* (2006.01)
*H01S 3/223* (2006.01)
*H01S 3/0941* (2006.01)
*H01S 3/0943* (2006.01)
*F21V 8/00* (2006.01)
*H01S 5/34* (2006.01)

(52) U.S. Cl.
CPC .............. *H01S 1/06* (2013.01); *H01S 3/0941* (2013.01); *H01S 3/22* (2013.01); *H01S 3/223* (2013.01); *H01S 5/005* (2013.01); *H01S 5/3401* (2013.01); *H01S 2302/02* (2013.01)

(58) Field of Classification Search
USPC ...................................... 372/4, 55; 331/94.1
See application file for complete search history.

(56) References Cited

OTHER PUBLICATIONS

International Search Report for International Application No. PCT/EP2016/069622 dated Oct. 10, 2016.
Written Opinion issued in Patent Application No. PCT/EP2016/069622.
Belkin, Mikhail et al. "Terahertz Quantum-Cascade-Laser Source Based on Intracavity Difference-Frequency Generation" In: Nature Photonics, May 2007, vol. 1, pp. 288-292.
Harrison, R.G., et al. "A Simple and Efficient Optically Pumed NH3 Laser System" In: Optics Communications, Sep. 1980, vol. 34. No. 3, pp. 445-446.
Couzi, M. et al. "Characterization of NH4Br:Cu2+ Crystals: Direct Evidence of NH3 Through Raman Sectroscopy" In: Solid State Communications, Aug. 1, 1994, vol. 91, No. 6, pp. 481-485.
Lu, Q.Y. et al. "Widely Tuned Room Temperature Terahertz Quantum Cascade Laser Sources Based on Difference-Frequency Generation" In: AIP Applied Physics Letters, Dec. 2012, vol. 101, No. 251121, p. 1-4.
Rolland, C. et al. "Tunable-Diode-Laser Measurements of Gain in Optically Pumped NH3" In: Optics Letters, Optical Society of America, Jan. 1, 1983, vol. 8, No. 1, pp. 36-38.
White, J.D. et al. "High Power, High Efficiency Optically Pumped NH3 Lasers" In: Applied Physics B. Photo-physics and Laser Chemistry, Nov. 1990, vol. B51, No. 5, pp. 371-373.
Chang, T.Y., et al. "cw Laser Action at 81.5 and 263.4 [MU]M" In: Optically Pumped Ammonia Gas In: Applied Physics Letters, Jan. 1970, vol. 17, No. 9, pp. 357-358.
Toshiro, Koizumu et al. "Wide-Range Amplification of a Tunable Diode Laser Using an Optically Pumped High-Pressure NH3 Gas" In: Digest of Technical Papers—Conference on Lasers and Electro-Optics., Jan. 1984, p. 254.
Tashiro, H. et al. "Wide-Range Amplification of a Tunable Diode Laser Using an Optically Pumped High-Pressure NH3 Gas" In: Optics Letters, Jul. 1984, vol. 9, No. 7, pp. 279-281.

* cited by examiner

TERAHERTZ LASER, TERAHERTZ SOURCE AND USE OF SUCH A TERAHERTZ LASER

This is a National Stage application of PCT international application PCT/EP2016/069622, filed on Aug. 18, 2016 which claims the priority of French Patent Application No. 1557827, filed Aug. 20, 2015, both of which are incorporated herein by reference in their entirety.

TECHNICAL FIELD

The invention relates to the field of terahertz measurements and imaging and more particularly relates to the electromagnetic wave sources which emit in the terahertz frequency range and which allow such measurements and such imaging. These electromagnetic wave sources are conveniently called "terahertz sources" in the rest of this document.

STATE OF PRIOR ART

In spite of the strong potentials they could offer, the terahertz measurements and imaging remain not very widespread because of the absence of suitable optical sources in the terahertz frequency range. Indeed, in these emission frequencies between 700 and 1200 GHz, continuous electromagnetic wave sources are relatively rare and remain relatively complex.

Indeed, these terahertz sources can for example be provided by generating by means of non-linear effect of harmonics of a microwave source or by a frequency difference of two optical frequencies. The conversion efficiency of these methods however remains low. These sources emitting directly in the terahertz field are carcinotrons. These terahertz sources are complex to use and are therefore rarely used with the exception of research laboratories. Actually, they require a high vacuum, high voltages and a strong magnetic field which make them of a low compatibility with an industrial or commercial use.

Another way used to provide terahertz sources is the optical pumping of a resonant cavity in which an amplifier medium as a gas is located. The optical pumping is achieved by a so-called pump laser source.

In such a configuration, to achieve a terahertz emission, it is necessary that the pump laser source and the amplifier medium fulfil a number of criteria. The emission wavelength of the pump laser source has to match at least partially an excitation energy of the molecules of the amplifier medium from an initial state to an excited state. This excited state has to be a state in which the molecules of the amplifier medium are likely to be de-excited by a transition the energy of which corresponds to an emission frequency between 700 and 1200 GHz. In this way, and with a resonant cavity having suitable dimensions, the pump laser source enables, by placing part of the molecules of the amplifier medium in the excited state, a population inversion to be provided in order to generate a laser effect in the resonant cavity.

In a conventional configuration, that is using an optical pumping with a single pump laser source and without stressing the amplifier medium other than by the optical pumping, there are few optical sources in the vicinity of the terahertz frequency range. For example, commercial sources provided by Edinburgh Instruments® can be mentioned, which use a resonant cavity which can use amplifier media such as difluoromethane and methanoic acid which provide an emission at frequencies of 1627 GHz and 693 GHz respectively, which are not included in the terahertz frequency range. If some of these sources can be terahertz sources, however, they have generally low efficiencies, related to a low wavelength tuning between the emission line of the pump source, conventionally a $CO_2$ laser, and the energy level to be excited of the amplifier medium.

In the terahertz frequency range, the terahertz source described by Chang and co-authors in their work published in the scientific review "Applied Physic Letters" volume 17 pages 357 to 358 in 1970 is known, which enables to have a good wavelength tuning between the pump source and the energy level to be excited.

This terahertz source includes a cavity optically pumped by means of a nitrous oxide laser, the amplifier medium of the cavity being ammonia gas. The pump radiation of the nitrous oxide laser enables ammonia molecules to be placed in an excited state in which they are likely to be de-excited in an intermediate state by a rotation transition. The energy of this rotation transition corresponds to an emission frequency of 3.68 THz. The ammonia molecules in this intermediate state are thereby likely to be de-excited by a so-called energy "inversion" transition corresponding to an emission frequency of 1.14 THz (a phenomenon known as "transition cascade"). This inversion transition is possible by virtue of the tunnel effect which enables the nitrogen atom to pass through the triangle formed by the three hydrogen atoms (the pyramidal shaped molecule $NH_3$ is reversed as an umbrella). Thus, with the cavity proposed by Chang and co-authors, such a terahertz source enables a double emission to be provided, one of the emission frequencies of which is included in the terahertz frequency range. However, this source has a low efficiency, because it uses a transition cascade, and only gives access, in the terahertz range, to the single emission frequency of 1.14 THz.

In order to overcome this problem of wavelength tuning between the pump source and the energy level to be excited of the amplifier medium, there are also optical sources in the terahertz frequency range having less conventional configurations, making use of phenomena such as the Stark effect or two-photon optical pumping. If these optical sources are not limited to a single emission frequency in the terahertz range as is the case for the conventional configuration suggested by Chang and co-authors, they are relatively complex. Indeed, making use of the Stark effect requires both to apply a strong electric field to the amplifier medium whereas the two-photon optical pumping requires two distinct sources and has a relatively low efficiency with respect to a single-photon pumping.

Moreover, if recent work, such as that of Belkin and co-authors published in the scientific review "nature photonics" volume 1, pages 288 to 292 or even that of Q. Y. Lu and co-authors published in the scientific review "Applied Physics Letters" volume 101 page 251121(1-4) in 2012, has demonstrated possibility of providing optical sources the emission frequencies of which are in the terahertz range using a generation by intracavity frequency difference with two quantum cascade lasers, these optical sources emit at emission frequencies of 1 to 5 THz. However, these sources have a conversion efficiency which strongly lowers in the terahertz range and thus are of no or low exploitability.

Thus, currently, to perform terahertz measurements and imaging in the terahertz frequency range, there is no continuous optical source type which is both simple, and thus does not use an effect such as the Stark effect or double photon pumping and requires a low temperature, and which gives access to several emission frequencies in this frequency range, the terahertz source of Chang and co-authors, for example, only giving access to an emission frequency of 1.14 THz. It will be further noted that the terahertz source of Chang and co-authors does not enable an emission to be achieved in the frequency ranges around 850, 940 and 1040 GHz for which the atmosphere losses are relatively contained because they are lower than 0.5 dB/m.

DISCLOSURE OF THE INVENTION

The present invention aims at overcoming these drawbacks and thus has the object to provide a terahertz source which is simple and gives access to several discrete emission frequencies in the terahertz frequency range.

The invention has also the object to provide a terahertz source which is simple and which gives access to an emission in the terahertz frequency range at frequencies lower than 1060 GHz and in particular in frequency ranges around 850, 940 GHz and 1040 GHz.

Above and in the rest of this document, by frequency ranges around 850 GHz, 940 GHz and 1040 GHz, it is meant frequency ranges whose frequencies have a frequency difference with said frequency value lower than or equal to 20 GHz. Thus, for example, the frequency range around 850 GHz corresponds to frequencies v respecting the following inequality:

830 GHz≤v≤870 GHz.

To that end, the invention relates to a terahertz laser adapted to emit at least a first electromagnetic radiation a first emission frequency of which is between 700 GHz and 1200 GHz, said laser including:
an infrared laser source,
a resonant cavity arranged to be optically pumped by the infrared laser source, said resonant optical cavity containing ammonia gas as an amplifier medium and having at least one configuration for which the resonant cavity is a resonant cavity at the first emission frequency,
the infrared laser source being a continuous semiconductor laser source capable of exciting the molecules of the amplifier medium from an initial energy level to at least a first excited energy level, the molecules of the amplifier medium placed in this first excited energy level being likely to be de-excited by a pure inversion transition related to the umbrella type inversion mode of the ammonia molecule, the de-excitation energy of which corresponds to the first emission frequency.

Such a terahertz laser, directly using the inversion transitions of ammonia molecules, gives access to many emission frequencies distributed on the entire terahertz frequency range. Indeed, the ammonia inversion transitions, if an excitation of the single vibration mode $v_2$ by the branch Q is taken, gives access to more than 85 emission lines for a laser according to the invention with an average and maximum frequency difference, between two accessible lines which succeed one another, of respectively 1 GHz and 480 GHz. In addition, the use of a semiconductor laser source, which has the advantage, unlike gas infrared laser sources, to be capable of emitting at a specific wave number or even to be wave number tunable, enables the inversion transition which will be excited in the resonant cavity to be specifically chosen.

Thus, the laser according to the invention enables a terahertz source to be provided in the terahertz frequency range which enables, by a suitable adaption of its resonant cavity and of its infrared laser source, to obtain a radiation the frequency of which can be chosen in a high number of discrete emission frequencies in the terahertz frequency range. Such a laser thus makes many optical applications contemplatable in the terahertz range such as terahertz measurements and imaging.

It will be further noted that an emission in the terahertz range generated by a pure inversion transition of ammonia makes it possible to have access to emission lines corresponding to emission frequencies lower than 1060 GHz and in particular to frequency ranges about 850, 940 and 1040 GHz. Such emission lines are particularly advantageous because of their low atmosphere absorption and thus with respect to atmosphere measurements possibilities they offer.

It is reminded that an ammonia molecule $NH_3$ in its ground state has 4 accessible vibration modes, two of which are degenerate:
mode $v_1$, which corresponds to the symmetric vibration elongation (A1) of the bonds NH,
mode $v_2$, which corresponds to the symmetric angular deformation (A1) of the bonds NH,
modes $v_{3a}$ and $v_{3b}$, which correspond to the doubly degenerate antisymmetric elongation (E) of the bonds NH,
modes $v_{4a}$ and $v_{4b}$, which correspond to the doubly degenerate angular deformation (E) between the bonds NH.

Each vibration mode has a corresponding number of rotation states accessible for the ammonia molecule which are defined by two parameters which are J and K. These states are themselves doubled by tunnel effect into two possible symmetries: the symmetric states (s) and the antisymmetric states (a). Thus, a vibration state of the vibration mode $v_2=1$ will be written as $v_2=1$ s(J,K) if it is symmetric and $v_2=1$ a(J,K) if it is antisymmetric respectively, with J the quantum number which defines the rotational angular momentum of the molecule and K the quantum number which defines the vectorial component of the rotational angular momentum along the main symmetry axis of the molecule. J is a positive quantum number, thus a non-negative integer. Since, K is the projection of J on the symmetry axis of the molecule, it is an integer between −J and +J. Each vibration-rotation-symmetry state corresponds to an energy level. Thus, if the state of an ammonia molecule is quantized, both the vibration-rotation-symmetry state of the molecule as well as the energy level in which it is located can be mentioned.

It is also reminded that an infrared optical transition of a vibration-rotation-symmetry mode of the ammonia molecule to another vibration-rotation-symmetry mode of the ammonia molecule for a parallel band as $v_2$ has to fulfil the following conditions (selection rules): $\Delta v=-1$ or $+1$, $\Delta K=0$, $\Delta J=-1$, 0 or $+1$, and a←s or s←a. These three types of transitions, or branches, are respectively called transition of the branch P if $\Delta J=-1$, transition of the branch Q if $\Delta J=0$ and transition of the branch R if $\Delta J=+1$.

In a given vibration-rotation-symmetry mode, an ammonia molecule is likely to be de-excited by different transitions. Thus, in the case of the invention, a molecule likely to be de-excited by a so-called "pure" inversion transition is a molecule likely to be de-excited from a vibration of the a(J,K), thus antisymmetric, type into an s(J,K), thus symmetric, vibration state, wherein the vibration and rotation state does not change ($\Delta v=0$, $\Delta K=0$, $\Delta J=0$). Thus, within the scope of the invention, the laser source is capable of exciting an ammonia molecule from an initial state $v_x=0$ s(J,K) (x being chosen from 1, 2, 3a, 3b, 4a, 4b) into an excited vibrational state of the type $v_x=1$ a(J,K), such a transition is thus a transition of the branch Q. In this excited vibrational state, the ammonia molecule is likely to be de-excited by a pure inversion transition in a vibrational state $v_x=1$ s(J,K). Such a transition is a direct transition, that is the molecule is likely to be directly de-excited by an inversion transition in the vibrational state $v_x=1$ s(J,K). During this de-excitation, the molecule switches from the vibrational state in which it has been excited by the optical pumping to a vibrational state with a lower energy by a pure inversion transition without passing through an intermediate vibrational state.

It is also to be noted that the ammonia gas in the amplifier medium can be of two isotope types, the ammonia $^{14}NH_3$ the nitrogen of which is the isotope 14 and ammonia $^{15}NH_3$ the nitrogen of which is the isotope 15. Of course, each of these isotope types of ammonia includes its own vibrational state energies. Such an isotopy of the ammonia molecule thus enables the number of emission lines accessible by a laser according to the invention to be doubled in the terahertz range.

The infrared laser source can be a quantum cascade laser.

Such a semiconducting laser source is particularly suitable for providing an efficient pump radiation at an infrared wavelength capable of exciting the molecules of the amplifier medium with a good wavelength tuning between the laser source and the energy level to be excited of the amplifier medium. Indeed, such quantum cascade lasers can easily be wavelength tunable to ensure such a wavelength tuning. If the strong powers accessible with such sources are added, which can further be combined to each other, they enable a good optical pumping of the resonant cavity and thus an efficient terahertz emission to be ensured.

The terahertz laser can be adapted to emit at least a second electromagnetic radiation a second emission frequency of which is between 700 GHz and 1200 GHz, wherein the infrared laser source is a quantum cascade laser tunable to a wavelength range including at least two wavelengths capable of exciting the molecules of the amplifier medium from the initial energy level to the first and a second excited energy level respectively, the molecules of the amplifier medium placed in this second excited energy level being likely to be de-excited by a pure inversion transition related to the umbrella type inversion mode of the ammonia molecule the de-excitation energy of which corresponds to the second emission frequency, the resonant cavity having at least one configuration for which the resonant cavity is a resonant cavity at the second emission frequency.

Such a terahertz laser enables a modulable terahertz source to be provided because it is capable of providing at least two emission frequencies in the terahertz range with a single configuration. Indeed, the cavity and infrared laser source are both tunable, therefore the laser emissions at both these frequencies have both a good efficiency. It will be noted that this is particularly advantageous regarding terahertz sources of prior art which are generally adapted to emit at a single emission frequency.

The first energy level excited by the infrared laser source can be a vibration energy level $v_2=1$ accessible by a transition of the branch Q with a quantum number J lower than 10.

Such an energy level is particularly advantageous because it gives access with a good emission efficiency to a great number of emission frequencies included in the terahertz range. Thus and as illustrated in FIGS. 4a and 4b, even with a single ammonia type, regardless of whether it is ammonia the nitrogen of which is the isotope 14 or ammonia the nitrogen of which is the isotope 15, it is possible to provide a terahertz laser according to the invention with an emission frequency chosen in the terahertz range without being really limited in choosing this frequency. Indeed, two consecutive accessible emission frequencies have a difference which is lower than 30 GHz and which is equal to 15 GHz on average.

The ammonia gas is chosen in the group including ammonia the nitrogen atom of which is the isotope 14, ammonia the nitrogen atom of which is the isotope 15 and a mixture thereof, and wherein the relative volume proportion in the amplifier medium of one from ammonia the nitrogen atom of which is the isotope 14 and ammonia the nitrogen atom of which is the isotope 15 is higher than 90% and preferentially than 95%.

With such a gas mixture as an amplifier medium, the emission is particularly efficient since most of the molecules of the amplifier medium are likely to participate in emission.

The ammonia gas can be a mixture of ammonia the nitrogen atom of which is the isotope 14 and ammonia the nitrogen atom of which is the isotope 15, the relative volume proportions in the amplifier medium of ammonia the nitrogen atom of which is the isotope 14 and ammonia the nitrogen atom of which is the isotope 15 being both between 40 and 60%.

With such a gas mixture, the laser source gives access to a great number of emission frequencies since the emission frequencies of ammonia the nitrogen atom of which is the isotope 14 and ammonia the nitrogen atom of which is the isotope 15 are accessible.

The ammonia gas can be a mixture of ammonia the nitrogen atom of which is the isotope 14 and ammonia the nitrogen atom of which is the isotope 15, the resonant cavity being configured to enable the relative volume proportions in the amplifier medium of ammonia the nitrogen atom of which is the isotope 14 and ammonia the nitrogen atom of which is the isotope 15 to be modified.

Such a laser source enables, by offering the possibility to modify the composition of the amplifier medium, the emission frequency from those offered by ammonia the nitrogen atom of which is the isotope 14 and ammonia the nitrogen atom of which is the isotope 15 to be easily chosen while keeping intact the emission efficiency.

The terahertz laser can include at least one infrared optical fibre, such as a hollow optical fibre, comprising a first and a second end, the first end being connected to the outlet of the infrared laser source and the second end being connected to the resonant cavity so as provide an optical connection between the infrared laser source and the resonant cavity.

By infrared optical fibre it is meant above and in the rest of this document, an optical fibre adapted to transmit electromagnetic radiations included in the infrared range. It will be noted that an infrared optical fibre can thus be a hollow optical fibre, a chalcogenide glass optical fibre or a microstructured optical fibre.

The infrared laser source can be adapted to emit a pump radiation to optically pump the resonant cavity, and wherein the resonant cavity can include an inlet for injecting the pump radiation the dimensions of which are lower than c/1,706f with c being the velocity of light and f the first emission frequency, the dimensions of the inlet for injecting the pump radiation being preferentially lower than c/2f.

The inlet for injecting the pump radiation can have dimensions lower than 176 µm.

The outlet of the infrared laser source can be positioned at the inlet of the resonant cavity.

Such configurations enable a laser according to the invention to be provided with an optimised optical coupling.

By outlet of the infrared source placed "at the inlet of the resonant cavity" it is meant above and in the rest of this document that said outlet is disposed with respect to said inlet such that the inlet intersepta the entire emission cone of the infrared radiation exiting the outlet of the infrared laser source. More generally, such a characteristic corresponds to an outlet of infrared laser source which is aligned with the optical axis of the resonant cavity at a distance from the inlet of the resonant cavity which is lower than one centimeter.

The resonant cavity can include a converging lens arranged to decrease the divergence of the pump radiation at the outlet of the inlet window.

Such a lens enables a good optical pumping of the amplifier medium to be ensured.

The invention further relates to a terahertz source adapted to emit at least a third electromagnetic radiation a third emission frequency of which is between 700 GHz and 1200 GHz, the terahertz source including:
  a terahertz laser according to the invention,
  a hyperfrequency source capable of emitting a hyperfrequency radiation the emission frequency of which is between 1 GHz and 200 GHz,
  a non-linear medium or device arranged to mix the first terahertz radiation provided by the terahertz laser and the hyperfrequency radiation to provide the third radiation.

Such a source enables a third radiation to be provided, the emission frequency of which can be precisely chosen in the terahertz range thanks to the frequency offset offered by the use of the non-linear medium or device.

The invention further relates to the use of a terahertz laser according to the invention to perform imaging, spectroscopy, data transmission or obstacle detection in the terahertz range.

Such a use benefits from tunability and good efficiency possibilities offered by a laser according to the invention.

BRIEF DESCRIPTION OF THE DRAWINGS

The present invention will be better understood upon reading the description of exemplary embodiments, given by way of purely indicating and in no way limiting purposes, making reference to the appended drawings in which.

Identical, similar or equivalent parts of the different figures bear the same reference numerals so as to facilitate switching from one figure to the other.

The different parts represented in the figures are not necessarily drawn to a uniform scale, to make the figures more readable.

The different possibilities (alternatives and embodiments) should be understood as being not exclusive to each other and can be combined to each other.

DETAILED DISCLOSURE OR PARTICULAR EMBODIMENTS

Figure 1:
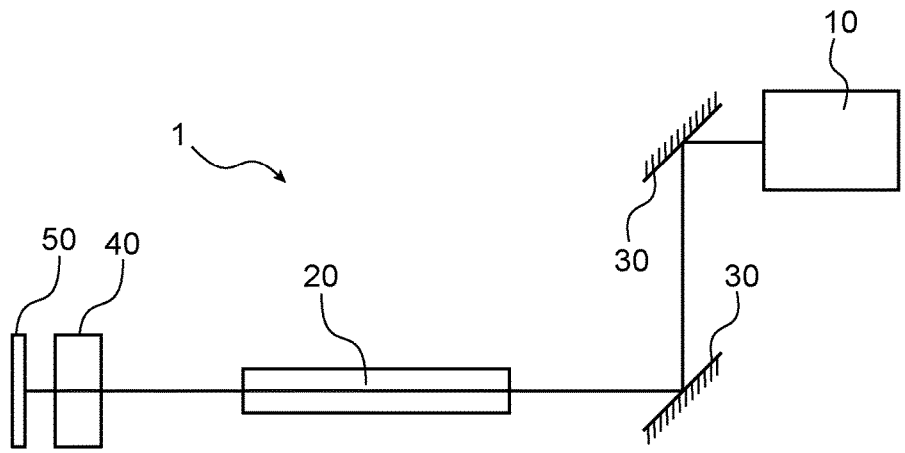
FIG. 1 schematically illustrates a laser according to a first embodiment of the invention.

FIG. 1 schematically illustrates a terahertz laser 1 according to the invention. Such a terahertz laser 1 is adapted to emit at least one first electromagnetic radiation a first emission frequency of which is included in the terahertz frequency range between 700 GHz and 1200 GHz. This terahertz laser 1 is more particularly dedicated to terahertz measurements and/or imaging as is illustrated in FIG. 1 in which a sample 40 subjected to the terahertz laser radiation, and a THz detector 50 for detecting the THz radiation from this subjection are shown.

The terahertz laser 1 includes:
  an infrared laser source 10,
  a resonant cavity 20 arranged to be optically pumped by the infrared laser source 10, said resonant cavity containing ammonia gas $NH_3$ as an amplifier medium.

The infrared laser source 10 is a semiconductor continuous laser source capable of exciting molecules of the amplifier medium from an initial energy level to at least a first excited energy level, the molecules of the amplifier medium placed in this first excited energy level being likely to be de-excited by a pure inversion transition the de-excitation energy of which corresponds to the first emission frequency.

The first excited energy level is, for a molecule placed in the same to be likely to be spontaneously de-excited by an inversion transition, an energy level corresponding to an a(J,K) type antisymmetric vibration state from which the molecule is likely to be de-excited into an energy level corresponding to an s(J,K) type symmetric vibration state.

In a usual application of the invention, the first energy level excited by the infrared laser source 10 is an accessible energy level by a transition of the branch Q with a J, the quantum number which defines the rotational angular momentum of the molecule, being lower than 10. The vibration mode in which the ammonia molecules are excited in this usual application of the invention is the vibration mode $v_2$.

Figure 2:
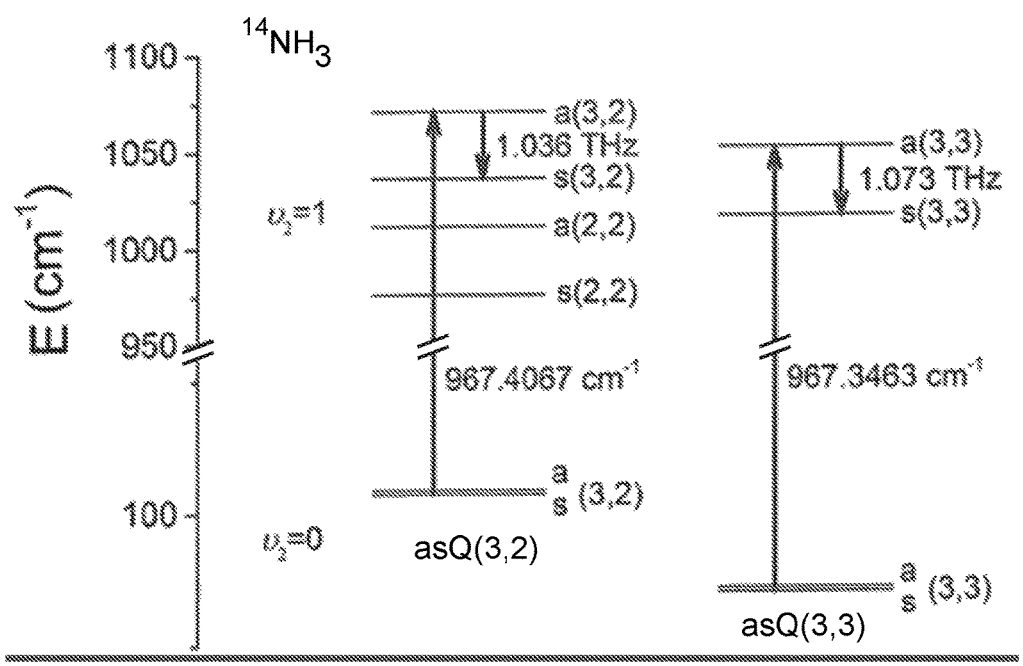
FIG. 2 illustrates the energy diagrams of two energy transitions of the ammonia molecule which are likely to be used in a laser according to the invention.

The principle of such an adaption of the infrared laser source 10 is illustrated in FIG. 2 in the case where the resonant cavity includes ammonia the nitrogen of which is the isotope 14. Thus, if the example on the left of FIG. 2 is taken, the infrared laser source 10 can be an infrared laser having at least one configuration in which its emission wave number is equal to 967.4067 cm$^{-1}$. With such a wave number, the pump radiation emitted by the infrared laser source 10 is capable of exciting the ammonia molecules of the resonant cavity being in a ground state $v_2$=0 s(3.2) to an excited level $v_2$=1 a(3.2). The ammonia molecules in this energy level are likely to be de-excited by a pure inversion transition into an excited level $v_2$=1 s(3.2). During this de-excitation, a photon corresponding to the energy of this pure inversion transition is emitted. The emission frequency of this photon, corresponding to the first frequency, is 1.036 THz and is included in the terahertz range.

In the same way, if the example on the right of FIG. 2 is taken, the laser source can be an infrared laser source having at least one configuration in which its emission wave number is equal to 967.3463 cm$^{-1}$. With such a wave number, the pump radiation emitted by the infrared laser source 10 is capable of exciting the ammonia molecules of the resonant cavity being in a ground state $v_2$=0 s(3.3) to an excited level $v_2$=1 a(3.3). The ammonia molecules in this energy level are likely to be de-excited by a pure inversion transition into an excited level $v_2$=1 s(3.3). During this de-excitation, a photon corresponding to the energy of this inversion transition is emitted. The emission frequency of this photon, corresponding to the first frequency, is 1.073 THz and is included in the terahertz range.

In order to provide such an adaption, according to a first possibility of the invention, the laser source can be a tunable laser source adapted to emit in a wavelength range at least partially contained in the infrared range. This wavelength range comprises the emission wave number to excite the molecules of the amplifier medium from the initial energy level to the first excited energy level. Thus, according to the examples of FIG. 2, the infrared laser source 10 is tunable in a wavelength range respectively comprising the emission wave number 967.4067 cm$^{-1}$ and 967.3463 cm$^{-1}$.

To allow such a possibility, the infrared laser source 10 can be a quantum cascade laser tunable in the infrared and in particular in a wavelength range at least partially included in the wavelength range corresponding to the emission wave numbers ranging from 955 to 970 cm$^{-1}$.

According to a second possibility, the infrared laser source 10 can be a laser adapted to emit a single wavelength in the infrared range, this wavelength corresponding to the emission wave number to excite the molecules of the amplifier medium from the initial energy level to the first excited energy level. Thus, according to the examples of FIG. 2, the infrared laser source, according to this second possibility, emits at an emission wave number of 967.4067 cm$^{-1}$ or 967.3463 cm$^{-1}$.

According to an alternative of the invention applicable to both these possibilities, the infrared laser source can also be a diode type semiconductor laser such as for example a lead salt laser or one or more near infrared diode type semiconductor lasers followed by a non-linear conversion system at least one emission wavelength of which is a wavelength corresponding to an emission wave number between 955 and 970 cm$^{-1}$. In other words, the wavelength is included in the wavelength range from 10.309 μm to 10.471 μm.

The outlet of the infrared laser source 10 is optically coupled to the resonant cavity 20 so as to enable it to be optically pumped. In the first embodiment, as is illustrated in FIG. 1, the optical coupling between the outlet of the infrared laser source 10 and the resonant cavity 20 is made by means of two mirrors 30 which guide the pumping radiation emitted by the laser source towards the resonant cavity 20.

Figure 3:
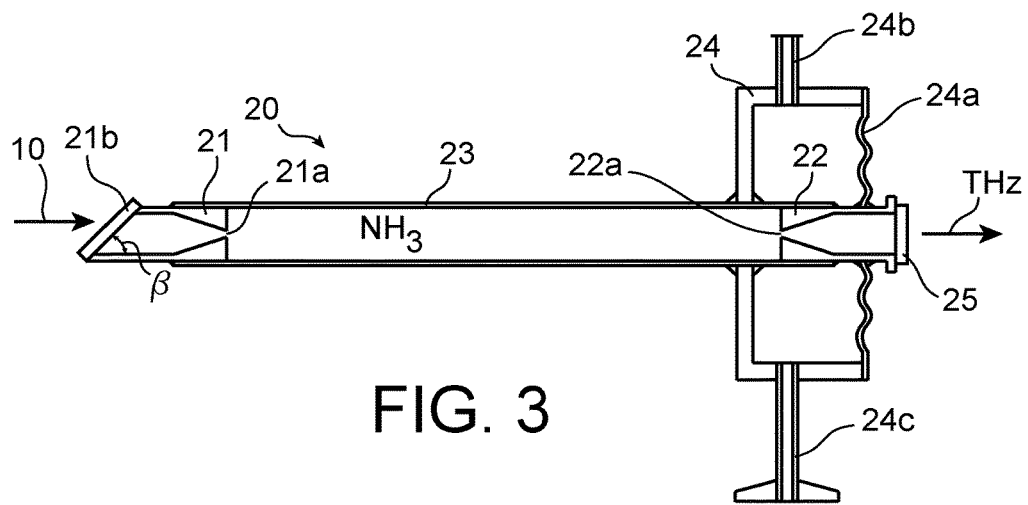
FIG. 3 illustrates an exemplary configuration of the resonant cavity of a laser according to the invention, FIGS. 4a and 4b respectively illustrate a graph of emission frequencies accessible by a laser according to the invention by an inversion transition, as a function of the wave number of the infrared laser source employed to pump the resonant cavity, and a frequency chart on which the different emission frequencies accessible by means of an inversion transition are represented, for both ammonia isotopes.

The resonant cavity 20 is a resonant cavity at the first emission frequency. FIG. 3 illustrates an example of configuration of the resonant cavity 20 according to the first embodiment.

The resonant cavity 20 includes:
  a tubular sidewall 23 delimiting the inside of the resonant cavity 20 and forming a waveguide in the terahertz waveguide range,
  a first mirror 21 closing the sidewall at one of its ends, the first mirror 21 including an aperture 21a for introducing the pumping radiation into the resonant cavity 20, said aperture 21a acting as an inlet for pump radiation in the resonant cavity 20,
  a second mirror 22 closing the sidewall 23 at the other of its ends, the second mirror 22 including an aperture 22a to extract part of the photons from the de-excitation of the molecules of the amplifier medium.

The first and second mirrors 21, 22 are mirrors at least partly reflecting in the terahertz wavelength range and advantageously in part of the infrared range comprising the emission wavelength of the infrared laser source. Depending on the excited transition, the losses of the cavity and the power of the pump radiation, the second mirror 22 will have a reflection coefficient chosen between 75 to 98%. The first mirror 21 has preferentially a high reflection coefficient, thus typically the reflection rate of the first mirror 21 is higher than 95%, or even 98%.

The first mirror 21 is thus preferentially the mirror which has the highest reflection rate in the terahertz range. Such a highest rate can in particular be achieved by a suitable diameter of the aperture 21a of the first mirror 21. Indeed, such an aperture forming a cylindrical conductive waveguide, the cut-off frequency of the ground mode TE$_{11}$ is given by:

$$f_c = \frac{c}{1,706d}$$

where c is the velocity of light and d is the aperture diameter. Thus, a diameter lower than 176 μm enables propagation of frequencies lower than 1 THz to be avoided. Thus, the aperture 21a of the first mirror, which forms an inlet for injecting the pump radiation, has dimensions lower than c/1,706f, the dimensions of the same aperture 21a being preferentially lower than c/2f.

More generally, for a first given emission frequency f, the aperture 21a forming the inlet for injecting the pump radiation has preferentially a diameter lower than c/1,706f. For an aperture 21a of the first rectangular or square mirror, the dimensions of the inlet of the aperture 21a forming the inlet for injecting the pump radiation, in particular its diagonals, are preferentially lower than c/2f.

Thus, for example, a circular aperture with a diameter 150 μm (cut-off frequency: 1.17 THz) will enable the pump infrared beam to be transmitted while prohibiting the propagation in the terahertz range.

The cavity also includes in FIG. 3, upstream of the first mirror, an infrared transparent window 21b. This window 21b is made of potassium bromide (KBr) or any other transparent material in the pump radiation range as sodium chloride NaCl, zinc selenide ZnSe, silicon Si or germanium Ge. The angle β of the window 21b with respect to the optical axis of the resonant cavity is chosen to be Brewster-incident so as to cancel the partial reflection of the pump radiation on said window 21b.

The shape of the second mirror 22 is adapted to limit the divergence of the terahertz radiation beam at the outlet of its window. Indeed, in order to provide a second mirror with a suitable reflection rate, the aperture 22a of the second mirror is in the order of the wavelengths corresponding to the terahertz range, that is in the order of 0.3 mm. Without a suitable shape enabling the radiation from the laser to be partially converged, the low dimension of the aperture 22a of the second mirror 22 diverges the outlet beam. The second mirror 22 can, to provide such an adaption to limit the beam divergence, have at the outlet of the aperture 22a a conical cross-section with an evenly increasing, preferentially monotonously, external diameter, along the optical axis of the resonant cavity 20. According to an alternative of the invention, the laser can also include downstream of the aperture 22 of the second mirror 22, a converging lens. According to an alternative of the invention, the mirror 22 can also consist of a metal grid, which can be self-contained or disposed at the surface of a dielectric support. In this case, the coupling is made on the entire mirror surface and enables the beam divergence to be minimised. According to prior art, this grid can be of the capacitive or inductive type.

The resonant cavity 20 is sealingly shaped so as to avoid ammonia leaks and thus limit ammonia losses which could be detrimental both for the power of the terahertz laser 1 and for a technician which would have to handle the laser.

The tubular sidewall 23 has a longitudinal tubular shape with a circular transverse cross-section. Of course, the sidewall 23 can also have another tubular shape without departing from the scope of the invention and can have, for example, a rectangular or more generally polygonal or elliptical transverse cross-section without departing from the scope of the invention. The sidewall 23 can be made of a metal such as copper. According to one possibility of the invention, the copper surface inside the resonant cavity 20 can also be covered with a dielectric such as for example a polymer. According to another possibility of the invention, the sidewall 23 can be made of a dielectric such as fused silica or glass.

In this first embodiment illustrated in FIG. 3, the second mirror 22 is movably mounted relative to the first mirror 21. Such a mounting enables the resonance frequency of the resonant cavity 20 to be easily modified.

The movable mounting of the second mirror 22 is provided by placing the second mirror 22 translationally free inside the sidewall 23 with a part of the second mirror 22 which projects therefrom and a sealed chamber 24 arranged around the second end of the sidewall 23. This sealed chamber 24 includes a partition wall 24a of flexible material, such as a metal membrane, connected to the part of the second mirror 22 projecting from the sidewall 23. In this manner, the flexibility offered by the flexible partition wall 24a, enables the second mirror 22 to be moved and enables, for a tunable infrared laser source 10, to make use of several inversion transitions of ammonia.

This movable mounting illustrated in FIG. 3 is only given by way of example and does not of course limit the invention. The invention encompasses any mounting type of the first and second mirrors 21, 22 in which the second mirror 22 is movable relative to the first mirror 21. Thus for example, the invention also encompasses the non-illustrated possibility according to which the sidewall 23 would include on a portion, a metal bellows so as to allow an extension of its length, the second mirror 22 being thereby attached to the second end of the sidewall 23. According to this possibility, it is the extension of the sidewall 23 permitted by the metal bellows which enables the second mirror 22 to be moved with respect to the first mirror 21. According to another non-illustrated possibility of the invention, it is also contemplatable that it is the first mirror 21 which is movably mounted with respect to the sidewall 23 and to the second mirror 22. With this possibility, the second mirror 22 is also movable relative to the first mirror so as to enable the resonance frequency of the resonant cavity 20 to be changed and thus to be tuned as a function of the first frequency chosen.

The movable mounting of the second mirror 22 relative to the first mirror 21 thus enables the resonance frequency of the resonant cavity 20 to be modified by suitably placing the second mirror 22 with respect to the first mirror 21. Thus, such a resonant cavity 20 is capable of having a first configuration in which the resonant cavity 20 is a resonant cavity at the first emission frequency and a second configuration in which the resonant cavity 20 is a resonant cavity at a second emission frequency.

In this first embodiment, the atmosphere of the resonant cavity can be modified both in composition and in pressure. To do this, the sealed chamber 24 is provided with a gas inlet 24b and a pumping outlet 24c. Thus, with a resonant cavity 20 according to this first embodiment can include ammonia gas as an amplifier medium chosen from the group including ammonia the nitrogen atom of which is the isotope 14, ammonia the nitrogen atom of which is the isotope 15 and a mixture thereof.

In the case where a single isotope of ammonia is required, the relative volume proportion in the amplifier medium of one from ammonia the nitrogen atom of which is the isotope 14 and ammonia the nitrogen atom of which is the isotope 15 is higher than 90% and preferentially than 95%.

On the other hand, in the case where it is preferred to have a mixture of both isotopes of ammonia, in particular to give access both to permissible emission frequencies with ammonia the nitrogen atom of which is the isotope 14 and with ammonia the nitrogen atom of which is the isotope 15, the relative volume proportions in the amplifier medium of ammonia the nitrogen atom of which is the isotope 14 and ammonia the nitrogen atom of which is the isotope 15 are both between 40 and 60%.

Of course, in the case where properties which are intermediate between those offered by these two types of relative volume proportions are searched for, the relative volume proportion in the amplifier medium of one from ammonia the nitrogen atom of which is the isotope 14 and ammonia the nitrogen atom of which is the isotope 15 can be intermediate between those of these two types of volume proportions without departing from the invention.

The ammonia pressure in the resonant cavity is preferentially between 1 µbar and 1 mbar, preferentially between 10 µbar and 500 µbar. Thus, the ammonia pressure in the resonant cavity can for example be equal to 50 µbar.

The gas inlet and this gas outlet 24b, 24c are respectively connected to an ammonia gas source and to a pumping system and enable the ammonia atmosphere to be defined in the resonant cavity 20. In this way, it is possible to modify the relative proportions of ammonia the nitrogen of which is the isotope 14 and ammonia the nitrogen atom of which is the isotope 15 in the resonant cavity 20.

Such a possibility of modifying the amplifier medium of the resonant cavity 20 is particularly advantageous in that it enables, in combination with the possibility to tune the pump radiation and the resonant frequency of the optical cavity, to make accessible both the terahertz emission lines of ammonia the nitrogen of which is the isotope 14 and those of ammonia the nitrogen atom of which is the isotope 15.

It is to be noted that alternatively, in the case for example where only the terahertz emission lines of one of ammonia the nitrogen of which is the isotope 14 and ammonia the nitrogen atom of which is the isotope 15 is necessary, the resonant cavity 20 can be hermetically sealed, the atmosphere of the resonant cavity being thereby predefined.

In order to ensure a hermetic closure of the second end of the sidewall, the resonant cavity 20 includes, on the second mirror, a window 25 of the second mirror 22 at least partially, preferentially fully, transparent to the terahertz frequencies. The window 25 of the second mirror 20 can be a window of cyclic olefin copolymer (known as COC) or even of polypropylene, quartz, polyethylene or polymethylpentene (better known as PMP or TPX).

A resonant cavity 20 according to this first embodiment optically coupled with a tunable infrared laser source 10, such as a quantum cascade laser, forms a terahertz laser 1 according to one possibility of the invention which is capable of emitting on all the accessible emission lines of ammonia gas in the terahertz range.

Figure 4A:
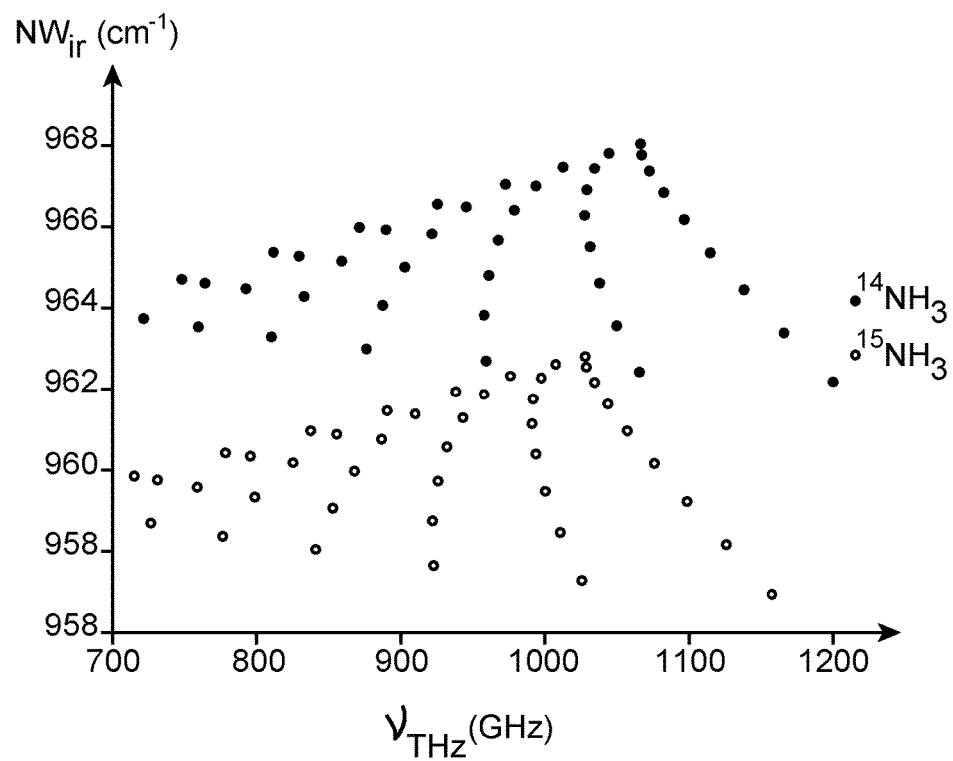
Figure 4B:
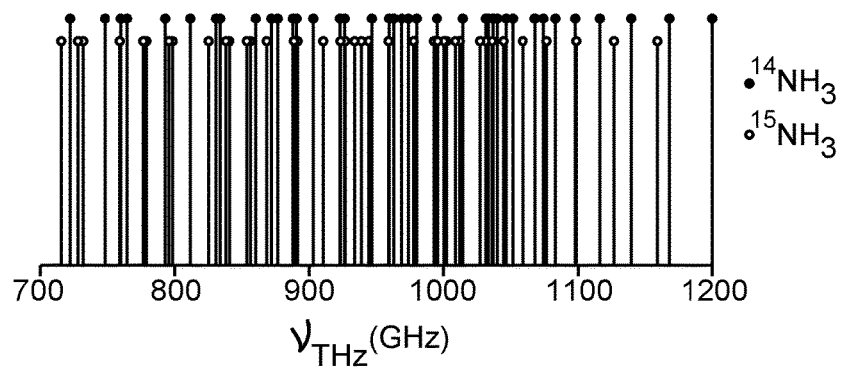

FIGS. 4a and 4b illustrate the accessible emission lines both for ammonia the nitrogen of which is the isotope 14 and ammonia the nitrogen of which is the isotope 15 for an inversion transition according to the invention with a pumping of the amplifier medium by an excitation of the branch Q of the vibration mode $v_2$ of the ammonia with J which remains lower than or equal to 10. FIG. 4a thus graphically illustrates the emission lines of ammonia with the emission frequency of the terahertz laser 1 in abscissa and the wave number of the pump radiation emitted by the infrared laser source 10 in ordinate. In this graph, it can be seen that the emission lines of ammonia the nitrogen of which is the isotope 14, represented by the black points, are distributed on the entire width of the terahertz range. The same observation can be made for the emission lines of ammonia the nitrogen of which is the isotope 15, represented by the circles in FIG. 4a. Thus, even with a single ammonia type, regardless whether it is ammonia the nitrogen of which is the isotope 14 or ammonia the nitrogen of which is the isotope 15, it is possible to provide a terahertz laser according to the invention with an emission frequency chosen in the terahertz range without actually limiting the choice for this frequency. Indeed, two consecutive accessible emission frequencies have a difference which is lower than 30 GHz and which is equal to 15 GHz on average.

It can be further observed, as is illustrated in FIG. 4b which is a chart representing on a frequency scale all the accessible emission lines according to the principle of the invention (band Q and vibration mode $v_2$=1, J<10), that a high number of emission lines is accessible in the part of the terahertz frequency range whose frequency is lower than 1060 GHz. This is particularly advantageous, since in this part of the terahertz range, the radiation attenuation is relatively low. Indeed, if a relative humidity of 50% is considered, the attenuation switches in turn from 0.1 dB/m, to 0.15 dB/m and 0.4 dB/m for the respective frequencies of the terahertz range which are the frequencies 840-860 GHz, 940 GHz and 1025-1040 GHz. Thus, this part of the terahertz range is particularly advantageous to perform measurements and/or imaging since it is possible to make them at ambient atmosphere and therefore does not require a particular atmosphere such as a dried or low pressure atmosphere, that is lower than the atmospheric pressure.

Likewise, the terahertz lasers 1 according to the invention, because of the high density of the emission lines, in particular because of the nitrogen isotopy, enables to benefit in the terahertz range from several doublets of emission lines, and thus of terahertz lasers, the emission frequency difference of which is lower than 1 GHz. The terahertz lasers according to the invention are thus adapted for use in a heterodyne receiver in the terahertz range. Such a use can be made by combining the two beams of two terahertz lasers with an emission frequency close to each other (difference lower than 1 GHz) by means of a mixer, for example a Schottky diode, and thus to generate this frequency difference. This frequency difference can then be electronically amplified so as to allow the detection of one of both beams.

It is this possibility which is demonstrated in table 1 below which lists the different doublets of emission lines which could be used for such an application. It will be noted that the doublets are only those located in the terahertz range and the frequencies of which are lower than 1040 GHz corresponding to the usual application of the invention, that is the vibration mode $v_2$=1 for an excitation by the branch Q and a J lower than 10.

TABLE 1 doublets of laser lines having a frequency difference lower than 1 GHz in the terahertz frequency range and the frequencies of which are lower than 1.04 THz, the first line of each doublet being an accessible line with ammonia the nitrogen of which is the isotope 14 whereas the second line of each doublet is an accessible line with ammonia the nitrogen of which is the isotope 15.

| | $^{14}NH_3$ | | $^{15}NH_3$ | | |
|---|---|---|---|---|---|
| | f (GHz) | Upper vibration state | f (GHz) | Upper vibration state | Δf(MHz) |
| f1 | 921.95 | v2 = 1 a(6.3) | 922.01 | v2 = 1 a(8.6) | −60 |
| f2 | 925.66 | v2 = 1 a(5.1) | 925.28 | v2 = 1 a(7.5) | 380 |
| f3 | 958.83 | v2 = 1 a(8.6) | 958.23 | v2 = 1 a(4.2) | 600 |
| f4 | 994.75 | v2 = 1 a(4.2) | 994.65 | v2 = 1 a(6.5) | 100 |
| f5 | 1029.37 | v2 = 1 a(5.4) | 1029.22 | v2 = 1 a(1.1) | 150 |
| f6 | 1030.53 | v2 = 1 a(4.3) | 1030.12 | v2 = 1 a(2.2) | 410 |
| f7 | 1035.82 | v2 = 1 a(3.2) | 1035.21 | v2 = 1 a(3.3) | 610 |

Of course, if in the first embodiment of the invention, the resonant cavity is a cavity the resonance frequency of which can be modified, the invention also encompasses the terahertz lasers the resonant cavity 20 of which has one and single configuration. In this configuration, the resonant cavity 20 is a resonant cavity at the first emission frequency.

Figure 5:
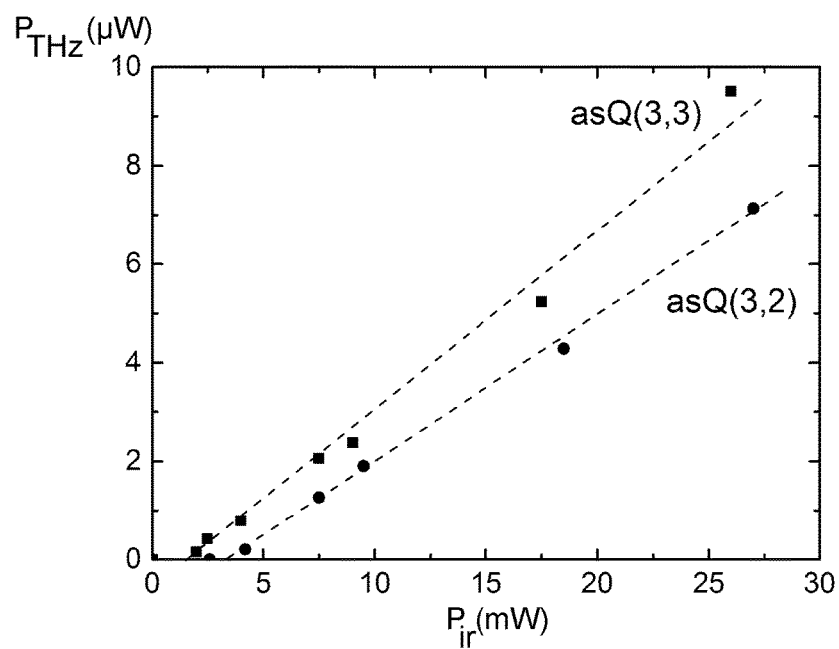
FIG. 5 is a graph experimentally illustrating the emission power of a laser according to the invention as a function of the power of the infrared laser source pumping the resonant cavity for two vibration-rotation modes of the ammonia molecule.

FIG. 5 experimentally illustrates the emission power of a laser according to the invention obtained by the inventors in a configuration similar to that of the first embodiment and illustrated in FIG. 3. During these measurements, the inventors have demonstrated the laser effect for two emission frequencies which are those which correspond to the energy schemes illustrated in FIG. 2. Thus, these are two cases of an excitation of ammonia molecules in the vibration mode by the branch Q, the first in the vibrational state $v_2$=1 a(3.2) (noted in Fig. asQ(3.2) and represented by black points), the second in the vibrational state $v_2$=1 a(3.2) (noted in Fig. asQ(3.3) and represented by black squares).

The accurate configuration of the resonant cavity used during these experimentations is the following one:
the sidewall 23 is a circular cross-section tubular sidewall 23 of copper which has an internal diameter of 10 mm and a cavity length of 50 cm,
each of the first and second mirrors 21, 22 is a brass mirror having an aperture 21a, 22a of a 1.2 mm diameter for introducing the pump radiation and extracting the laser radiation respectively, the ammonia gas pressure is maintained in the resonant cavity from 20 to 100 µbar.

It can be seen in FIG. 5 that the laser effect occurs both for the transition asQ(3.2) and for the transition asQ(3.3) at a pumping power of 2-3 mW and because of a symmetric aperture at the first and second mirrors 21, 22, the emitted power is divided by two. Actually powers in the order of 16-18 µW are reached for pumping with an infrared radiation of about 25 mW. The efficiencies reached during this experimentation of a laser according to the invention are thus relatively significant and the threshold pump powers are relatively low in comparison with those of a terahertz laser of prior art.

Figure 6:
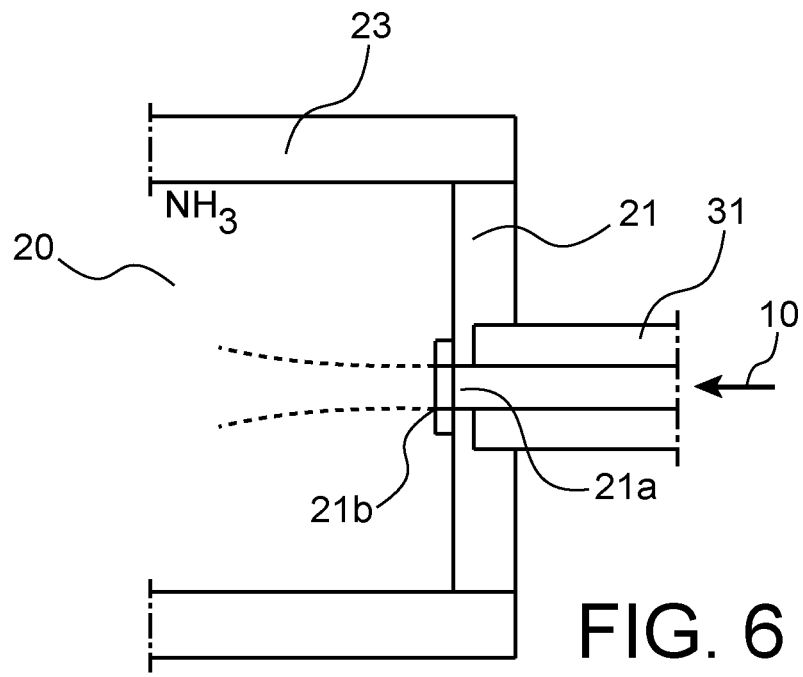
FIG. 6 illustrates an example of optical coupling between the resonant cavity and the pump laser by means of an optical fibre according to a second embodiment.

FIG. 6 illustrates the optical coupling between a resonant cavity 20 and an infrared laser source 10 according to a second embodiment. A terahertz laser 1 according to this second embodiment is differentiated in that the resonant cavity 20 and the infrared laser source are optically coupled to each other by an infrared optical fibre 31.

In FIG. 6, the infrared optical fibre 31 is a hollow type infrared optical fibre, that is the fibre core consists of air. However, it can be noted that if it is a so-called hollow optical fibre which is illustrated in FIG. 6, other infrared optical fibres are contemplatable without departing from the scope of the invention. Thus, the infrared optical fibre can also be, for example, an optical fibre with chalcogenide glass or a microstructured optical fibre.

To enable the infrared laser source 10 to be coupled this way to the resonant cavity 20 by the infrared optical fibre 31, the optical fibre 31 includes a first and a second end respectively connected to the outlet of the infrared laser source 10 and to the aperture the first mirror 21 of the resonant cavity 20. In order to house the second end of the infrared optical fibre 31, the first mirror 21 includes, on its face opposite to the second mirror 22, an accommodating cavity. Such an accommodating cavity enables the placement of the second end of the infrared optical fibre 31 to be facilitated such that the latter is perfectly aligned with respect to the aperture 21a of the first mirror 21.

In the case of the infrared optical fibre 31 of the hollow type illustrated in FIG. 6, in order to limit leak risks at the infrared optical fibre 31, the latter being hollow, the aperture 21a of the first mirror 21 is hermetically closed by an infrared radiation-transparent window 21b, for example of potassium bromide. Likewise and in the same way as the first embodiment, the reflection rate of the first mirror 21 can be optimised with an aperture 21a of the first mirror 21 the dimensions of which are lower than 176 µm and higher than 40 µm. This aperture 21a of the first mirror can thus be a circular port the diameter of which is between 176 µm and 40 µm. Thus, the port 21a does not let the laser radiation from the inversion transition of ammonia molecules pass whereas it permits the pump radiation the wavelength of which is lower than 70 µm to be introduced.

Figure 7:
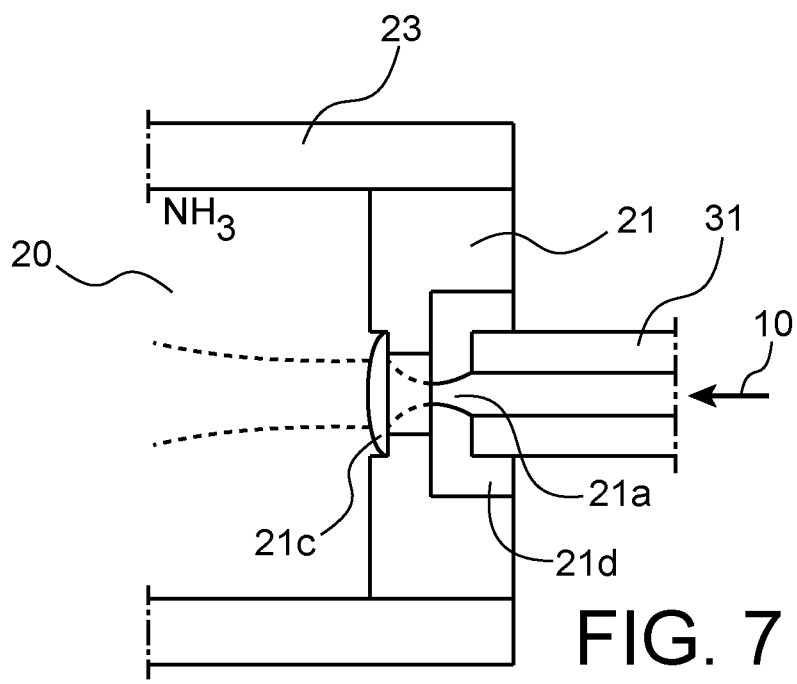
FIG. 7 illustrates another example of optical coupling between the resonant cavity and the pump laser by means of an optical fibre according to a third embodiment in which the resonant cavity includes a converging lens.

FIG. 7 illustrates a terahertz laser 1 according to a third embodiment in which the optical coupling by the infrared optical fibre 31 is optimised. A terahertz laser 1 according to this third embodiment is differentiated from a terahertz laser 1 according to the second embodiment in that the first mirror includes an adaption piece 21d in order to improve transmission of the pump radiation by the aperture 21a of the first mirror 21 and a converging lens 21c in order to compensate for divergence of the pump radiation upon passing through the adaption piece 21d of the first mirror 21.

The first mirror includes, at its aperture 21a, an accommodating cavity for the adaption piece 21d, the latter piece accommodating in turn the infrared optical fibre 31. The adaption piece 21d is made of a material at least partially reflecting in the infrared of the pump radiation and preferentially totally reflecting in this frequency range. The adaption piece includes an introducing port enabling the pump radiation to be injected. This introducing port has the same dimensional requirements as the aperture 21a of the first mirror 21 according to the second embodiment. The port of the adaption piece 21d can be circular with a minimum diameter, towards the second mirror 22, between 176 µm and 40 µm. The port, so as to improve injecting the pump radiation into the optical cavity, includes a conical cross-section with a maximum diameter, facing the infrared optical fibre 31, substantially equal to the core of the optical fibre, here the guiding cavity of the hollow type infrared optical fibre 31.

Since the port of the adaption piece 21d has the function not to let the terahertz radiation pass, the aperture 21a has no particular dimensional requirement. The first mirror 21 has, at the outlet of the aperture 21a, a shoulder to house the converging lens 21c. The focal distance of the converging lens 21c is preferentially dependent on the dimensions of the port of the adaption piece 21d so as to decrease the divergence of the pump radiation upon injecting into the resonant cavity 20. Alternatively, it is also possible to place between the fibre 31 and the piece 21d one or more converging lens in order to focus the pump infrared beam into the minimum diameter of the piece 21d.

Figure 8:
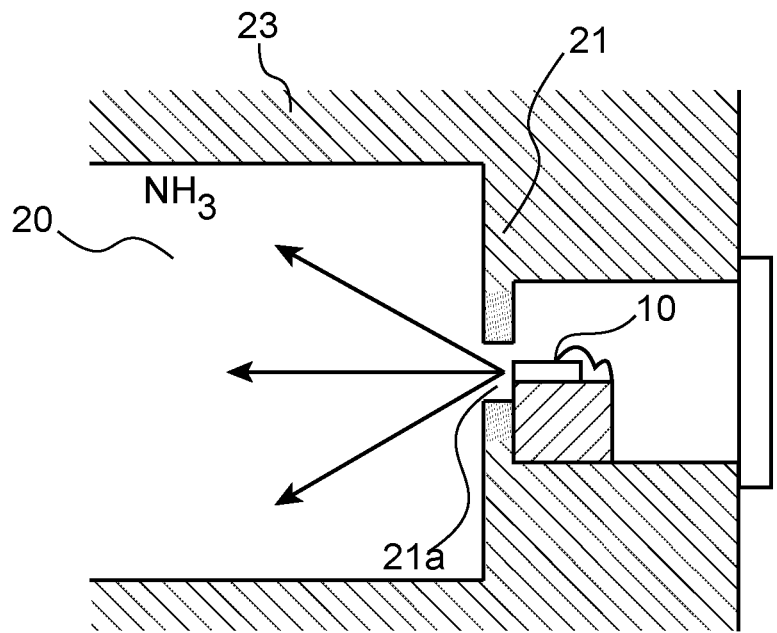
FIG. 8 illustrates a laser according to a fourth embodiment in which the resonant cavity includes an aperture acting as an inlet through which the pump radiation emitted by the infrared laser source is introduced and in which the outlet of the laser source is positioned at the inlet.

FIG. 8 illustrates a fourth embodiment of the invention in which the outlet of the infrared laser source 10 is directly positioned at the aperture of the first mirror 21, that is the inlet of the resonant cavity 20. A terahertz laser 1 according to this fourth embodiment is differentiated from a terahertz laser according to the second embodiment in that it does not require an optical coupling device between the infrared laser source 10 and the resonant cavity 20, such as mirrors 30 or an infrared optical fibre 31, the optical coupling being directly provided by placing the infrared laser source 10 with respect to the resonant cavity 20.

Such an embodiment is particularly adapted to outer resonant cavity-free semiconductor infrared laser sources thus having a particularly divergent optical outlet. With such an arrangement of the outlet of the infrared laser source 10 with respect to the inlet of the resonant cavity 20, that is, in FIG. 8, the aperture 21a of the first mirror 21, the entire emission cone of the infrared laser source is injected into the resonant cavity 20.

In order to ensure sealing, as shown in FIG. 8, in the extension of the cavity and of the first mirror, a sealed housing is provided, which is adapted to receive the infrared laser source 10. Alternatively, it is of course possible, in the same way as in the second embodiment, to provide the aperture 21a of the first mirror 21 with an infrared transparent window or to use a combination of lenses to focus the infrared radiation into the aperture 21a.

Figure 9:
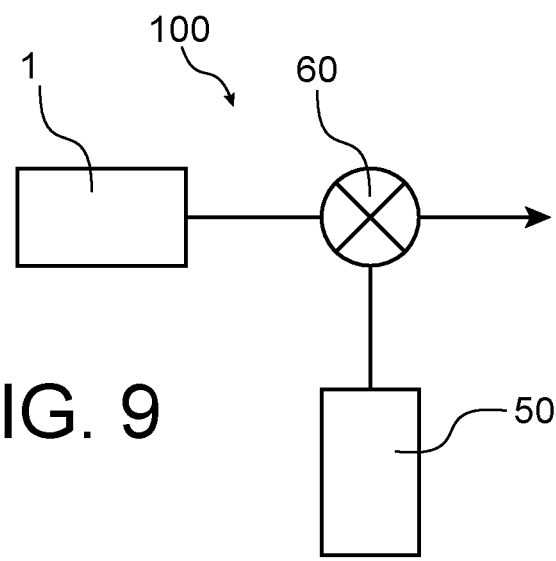
FIG. 9 illustrates a terahertz source including a terahertz laser according to the invention and an hyperfrequency source the respective emissions of which are combined by means of a non-linear medium or device.

FIG. 9 is a bloc diagram of a terahertz source 100 adapted to emit in the terahertz range, said terahertz source 100 including:
- a tera hertz laser 1 according to the invention, such as for example one of those of the first to fifth embodiments,
- a hyperfrequency source 50 capable of emitting an electromagnetic radiation between 1 GHz and 200 GHz, preferentially between 1 and 50 GHz,
- a non-linear medium or device 60, such as a Schottky diode, arranged to mix the terahertz radiation of the terahertz laser and the hyperfrequency radiation to provide the second terahertz radiation the emission frequency of which corresponds to the emission frequency of the terahertz radiation to which that of the electromagnetic radiation emitted by the hyperfrequency source 50 has been added to or subtracted from.

Such a terahertz source 100 enables an electromagnetic radiation source to be provided in the terahertz range the emission frequency of which is outside the emission lines accessible by a pure inversion transition of ammonia. By combining a terahertz laser source according to the invention and a frequency tunable hyperfrequency source, the entire terahertz range can thus be covered. Such a terahertz source 100 can enable new measuring systems to be developed, such as terahertz spectrometers, which could not have been developed to date for lack of adapted terahertz sources, in particular in terms of power.

According to a possibility of the invention, which is not illustrated, in order to ensure a suitable population inversion of the molecules of the amplifier medium and to limit molecule build-up risks in the energy level in which it is after de-excitation by an inversion transition, a second laser source can be provided. This second laser source has at least one configuration in which it emits a radiation the wavelength of which substantially corresponds to the energy difference between the radiation emitted by the infrared laser source and that emitted by the terahertz laser. In this manner, this second laser source will enable a transition of molecules of the amplifier medium to be stimulated from the energy level in which it is after de-excitation by an inversion transition to the initial level. Such a possibility enables the average life time of a molecule to be limited in the energy level in which it is after de-excitation by an inversion transition and the number of molecules likely to be placed in the first excited level by pumping by means of the infrared laser source to be increased.

In the embodiments described above, injecting the pump radiation occurs at one end of the resonant cavity along a longitudinal direction of the optical cavity. However, it is also contemplatable, without departing from the scope of the invention, that injection of the pump radiation is made according to a different geometry. Indeed, this injection can also occur along a tilted direction with respect to the longitudinal axis. Such a configuration, that can thereby be performed through side apertures provided in the sidewall, has the advantage of allowing pumping by several infrared laser sources.

Thus, in the same way, if in the embodiments described above, a single infrared laser source is implemented for the optical pumping of the optical cavity, it is also contemplatable, without departing from the scope of the invention, that the terahertz laser comprises two or more infrared laser sources to pump the optical cavity. Of course, these are several infrared laser sources emitting at the same wavelength in order to achieve a more efficient pumping of the resonant cavity and not a pumping with two wavelengths as is the case for some terahertz lasers of prior art.

On the other hand, if in the embodiments described above in which the terahertz laser emission can be modulated the optical pumping.

It can also be noted that if the terahertz lasers according to the invention are mainly dedicated to provide a continuous radiation, such a laser can be adapted to provide a pulse radiation by using a shutter, such as an acousto-optical, electro-optical or elasto-optical modulator, evenly shuttering, either the pump radiation provided by the infrared laser source, or the terahertz radiation emitted by the laser itself. Of course, regardless of the solution retained, the infrared laser source of a laser according to the invention remains a semiconductor continuous infrared laser source.

The terahertz laser 1 according to the invention is particularly dedicated to terahertz optical applications that are imaging, spectroscopy, data transmission and obstacle detection in the terahertz range.

What is claimed is:

1. A terahertz laser adapted to emit at least a first electromagnetic radiation a first emission frequency of which is between 700 GHz and 1200 GHz, said laser including:
   an infrared laser source,
   a resonant optical cavity arranged to be optically pumped by the infrared laser source, the resonant optical cavity containing ammonia gas as an amplifier medium and having at least one configuration for which the resonant optical cavity is a resonant cavity at the first emission frequency,
      wherein the infrared laser source is a continuous semiconductor laser source capable of exciting molecules of the ammonia gas from an initial energy level to at least a first excited energy level, the molecules of the ammonia gas placed in this first excited energy level being likely to be de-excited by a pure inversion transition related to an umbrella type inversion mode of ammonia molecule, a de-excitation energy of which corresponds to the first emission frequency.

2. The terahertz laser according to claim 1, wherein the infrared laser source is a quantum cascade laser.

3. The terahertz laser according to claim 2, adapted to emit at least a second electromagnetic radiation a second emission frequency of which is between 700 GHz and 1200 GHz, wherein the infrared laser source is a quantum cascade laser tunable to a wavelength range including at least two wavelengths capable of exciting the molecules of the ammonia gas from the initial energy level to the first and a second excited energy level respectively, the molecules of the ammonia gas placed in this second excited energy level being likely to be de-excited by a pure inversion transition related to an umbrella type inversion mode of the ammonia molecule the de-excitation energy of which corresponds to the second emission frequency,
   the resonant optical cavity having at least one configuration for which the resonant optical cavity is a resonant cavity at the second emission frequency.

4. The terahertz laser according to claim 1, wherein the first energy level excited by the infrared laser source is an energy level of vibration $v_2=1$ accessible by a transition of the branch Q with a quantum number J lower than 10.

5. The terahertz laser according to claim 1, wherein the ammonia gas is chosen from the group including ammonia the nitrogen atom of which is an isotope 14, ammonia the nitrogen atom of which is an isotope 15 and a mixture thereof,
   and wherein the relative volume proportion in the amplifier medium of one from ammonia the nitrogen atom of which is the isotope 14 and ammonia the nitrogen atom of which is the isotope 15 is higher than 90%.

6. The terahertz laser according to claim 1, wherein the ammonia gas is a mixture of ammonia the nitrogen atom of which is an isotope 14 and ammonia the nitrogen atom of which is the isotope 15, the relative volume proportions in the amplifier medium of ammonia the nitrogen atom of which is the isotope 14 and ammonia the nitrogen atom of which is the isotope 15 being both between 40 and 60%.

7. The terahertz laser according to claim 1, wherein the ammonia gas is a mixture of ammonia the nitrogen atom of which is an isotope 14 and ammonia the nitrogen atom of which is an isotope 15, the resonant cavity being configured to enable the relative volume proportions in the amplifier medium of ammonia the nitrogen atom of which is the isotope 14 and ammonia the nitrogen atom of which is the isotope 15 to be modified.

8. The terahertz laser according to claim 1, including at least one infrared optical fibre comprising a first and a second end, the first end being connected to the outlet of the infrared laser source and the second end being connected to the resonant optical cavity so as to provide an optical connection between the infrared laser source and the resonant optical cavity.

9. The terahertz laser (1) according to claim 1, wherein the infrared laser source is adapted to emit a pump radiation to optically pump the resonant optical cavity (20), and wherein the resonant cavity includes an inlet for injecting the pump radiation, a surface area of the inlet being entirely circumscribed by a circle having a diameter lower than $c/1{,}706f$ with c being the velocity of light and f the first emission frequency.

10. The terahertz laser according to claim 9, wherein the diameter of the circle is lower than $c/2f$.

11. The terahertz laser according to claim 1, wherein the outlet of the infrared laser source is positioned at the inlet of the resonant optical cavity.

12. The terahertz laser according to claim 9, wherein the resonant optical cavity includes a converging lens arranged to decrease the divergence of the pump radiation at the outlet of the inlet.

13. A terahertz source adapted to emit at least a third electromagnetic radiation a third emission frequency of which is between 700 GHz and 1200 GHz, the terahertz source including:

a terahertz laser according to claim 1, a hyperfrequency source capable of emitting a hyperfrequency radiation the emission frequency of which is between 1 GHz and 200 GHz, a non-linear medium or device arranged to mix the first terahertz radiation provided by the terahertz laser and the hyperfrequency radiation to provide the third radiation.

14. A use of a terahertz laser (1) according to claim 1, to perform imaging, spectroscopy, data transmission or obstacle detection in the terahertz range.

* * * * *

UNITED STATES PATENT AND TRADEMARK OFFICE
CERTIFICATE OF CORRECTION

PATENT NO.         : 10,333,267 B2
APPLICATION NO.    : 15/752976
DATED              : June 25, 2019
INVENTOR(S)        : Jean-François Lampin It is certified that error appears in the above-identified patent and that said Letters Patent is hereby corrected as shown below:

In the Specification

Column 7, Line 6, "inlet intersepta" should read -- inlet intersepts --

Signed and Sealed this
Twenty-second Day of December, 2020

Andrei Iancu
*Director of the United States Patent and Trademark Office*